United States Patent [19]

Drake

[11] Patent Number: 4,558,398

[45] Date of Patent: Dec. 10, 1985

[54] PRINTED CIRCUIT BOARD STORAGE CABINET

[76] Inventor: Leo O. Drake, Ridge La., Mill Neck, N.Y. 11765

[21] Appl. No.: 654,392

[22] Filed: Sep. 26, 1984

[51] Int. Cl.⁴ .............................................. H05K 7/14
[52] U.S. Cl. .................................... 361/415; 211/41; 361/394
[58] Field of Search ............... 361/390, 391, 393, 394, 361/399, 415; 211/41; 206/332, 334, 454

[56] References Cited

U.S. PATENT DOCUMENTS

| | | | |
|---|---|---|---|
| 3,377,515 | 4/1968 | Erb | 361/415 |
| 3,810,433 | 5/1974 | Posner | 211/41 |
| 4,075,683 | 2/1978 | Johansson et al. | 361/415 |
| 4,184,599 | 1/1980 | Drake et al. | 361/415 X |
| 4,277,120 | 7/1981 | Drake et al. | 361/415 X |

FOREIGN PATENT DOCUMENTS

| | | | |
|---|---|---|---|
| 897174 | 5/1962 | United Kingdom | 361/415 |
| 2065378 | 6/1981 | United Kingdom | 361/415 |

Primary Examiner—R. R. Kucia
Assistant Examiner—T. M. Basma
Attorney, Agent, or Firm—Bauer & Amer

[57] ABSTRACT

A storage cabinet for printed circuit boards is provided with a housing having a pair of substantially parallel and opposed flat surfaced support members on each of which is secured a plurality of printed circuit board retaining plates arranged in edge to edge relationship. The retaining plates are removably secured and held to the support members by inter-engagement means comprising a plurality of locking bars and at least one locking ridge integrally formed and projecting from the rear surface of each of the retaining plate. The locking bars have in cross section a portion overlying the plate and form therewith a lateral channel. The abutting surface of the support member is provided with a plurality of flexible first and second fingers integrally formed with the supporting member and projecting out of the plane of the supporting member. The first fingers are bent downwardly in a lateral direction opposite the second fingers to engage the locking ridge. The second fingers are bent downwardly and laterally from the plane of the support member to enter into the channel formed by the locking bars, whereby the first fingers act to continually urge the first fingers into the channel.

10 Claims, 6 Drawing Figures

PRINTED CIRCUIT BOARD STORAGE CABINET

BACKGROUND OF THE INVENTION

The present invention relates to the construction of printed circuit board STORAGE CABINETS and the like and in particular to cabinets having interchangeable retaining plates on which spare or currently unused printed circuit boards are retained, whereby the storage cabinet is adjustable and can be made to easily accommodate a variety of printed circuit board sizes.

Printed circuit board storage cabinets have been disclosed in my prior patents U.S. Pat. Nos. 4,184,599, Jan. 22, 1980 and 4,277,120, July 7, 1981. These storage cabinets are particularly advantageous for the storage of a large supply of spare, properly functional printed circuit boards, at locations where such boards are in constant use, such as telephone switching stations, computer terminal locations and the like. Such cabinets are also used to maintain a supply of printed circuit boards for performing alternate functions, different from those normally performed by the operating equipment.

The retaining and storage cabinets comprise a generally parallelepiped frame housing having top and bottom supporting members connected by a pair of height adjustable side walls. Attached to each of the top and bottom supporting members are several printed circuit board retainers each comprising a substantially flat planar plate having a plurality of parallel grooves of predetermined width. The printed board circuit retaining plates are arranged so as to be in paired opposition on the top and bottom supporting members allowing the printed circuit board to be slidably inserted in opposing grooves and be retained therein perpendicular to the top and bottom supporting members.

Each of the printed circuit board retaining plates is provided with means for interlocking with the adjacently disposed plates, so as to form a substantially continuous and unbroken planar surface of a plurality of said plates on the top and bottom supporting members respectively, as if the same were unitarily formed. In addition to the interlocking means along the edges of each plate, each of the plates are provided with means for detachably securing the plate to the top and bottom member, whereby the plates are rigidly held. Such detachable engagement means generally comprises a plug which is received in a preformed hole or aperture made in the top or bottom supporting surface. The arrangement as shown in the aforementioned patents secures and locks the retaining plates into fixed position more or less permanently.

While it is possible to ensure that printed circuit boards are formed in generally overall length and width dimensions similar to each other, it is more difficult to insure that their base thickness remains uniform, or that the overall thickness remains uniform, since the components mounted on the circuit boards may themselves vary in thickness. Therefore, it is advantageous to provide a printed circuit board storage cabinet which is capable of storing circuit boards of different thickness.

Accordingly, it has become the practice to provide the aforementioned storage cabinet with opposed pairs of printed circuit retaining plates, which have grooves of a different width than those of other paired retaining plates. This has had only an ameliorating effect in the solution of the problem for adjustability, since it is often impossible to determine beforehand the nature of the printed circuits which are required to be stored, so that once the storage cabinet has been assembled and put in place, it is difficult to make any adjustment for differences in thicknesses of boards to be stored.

The interlocking edge means, and the means for detachably engaging the plates to the top and bottom supporting surfaces respectively, do not allow for the swift and easy removal of any of the retaining plates and their subsequent replacement with other retaining plates having different width grooves. Further, banana plugs as used in U.S. Pat. No. 4,277,120 sometimes tend to break when withdrawn from their holes, and thus cease to function to effectively hold the plates in place when the plates are reused.

It is an object of the present invention to provide a printed circuit board storage cabinet, overcoming the disadvantages of the prior devices.

It is a further object of the present invention to provide a printed circuit board storage cabinet having retaining plates which are easily insertable and removable from the frame housing enabling plates having different configurations to be easily interchangeable with each other.

In particular, it is an object of the present invention to provide a printed circuit board storage cabinet which includes provision for facilitating the interchange of the retaining plates to accommodate printed circuit boards of differing base thickness, overall thickness, as well as overall width.

Further objects, features and advantages of the present invention will be more fully appreciated by reference to the following detailed disclosure of the present invention.

SUMMARY OF THE INVENTION

A storage cabinet for printed circuit boards is provided comprising a housing having a pair of substantially parallel and opposingly spaced flat surfaced support members on each of which is secured a plurality of printed circuit board retaining plates arranged in edge to edge relationship. Each of the retaining plates has grooves of predetermined width for the reception of printed circuit boards substantially perpendicular thereto.

According to the present invention, the retaining plates are removably secured and held to the support members by inter-engagement means comprising a plurality of locking bars and at least one locking ridge integrally formed and projecting from the rear surface of each retaining plate. The locking bars have in cross section a portion overlying the plate and form therewith a lateral channel. The abutting surface of the support member is provided with a plurality of flexible first and second fingers integrally formed with the supporting member and projecting out of the plane of the supporting member. The first fingers are bent downwardly in a lateral direction opposite the second fingers to engage the locking ridge. The second fingers are bent downwardly and laterally from the plane of the support member to enter into the channel formed by the locking bars, whereby the first fingers act to continually urge the first fingers into the channel.

With the foregoing construction, each of the printed circuit board retaining plates can be slidably inserted and removed, with respect to the surface of the support member, so that the fingers and the locking channel interengage and the resilient first fingers engage the locking ridge, locking and firmly fixing the plate in place. On release of the resilient first fingers, the entire assembly can be released and the printed circuit board retaining means can be slidably removed.

Preferably, the fingers on the supporting member, and the locking bars and the locking ridge on the retaining plate are arranged in a conforming geometric pattern so that each of the retaining plates can be provided with identically spaced locking bars and locking ridges conforming to the cooperating members on the supporting member whereby retaining plates can be easily exchanged one for the other. In this matter, the printed circuit board retaining grooves on each of the retaining plates can be made of predetermined different sizes from each other so that a single storage cabinet can be assembled to accommodate printed circuit boards of varying dimension.

Full details for the present invention are set forth in the following description and the accompanying drawings which constitute a preferred but nonetheless illustrative embodiment.

DESCRIPTION OF THE PRESENT INVENTION

Figure 1:
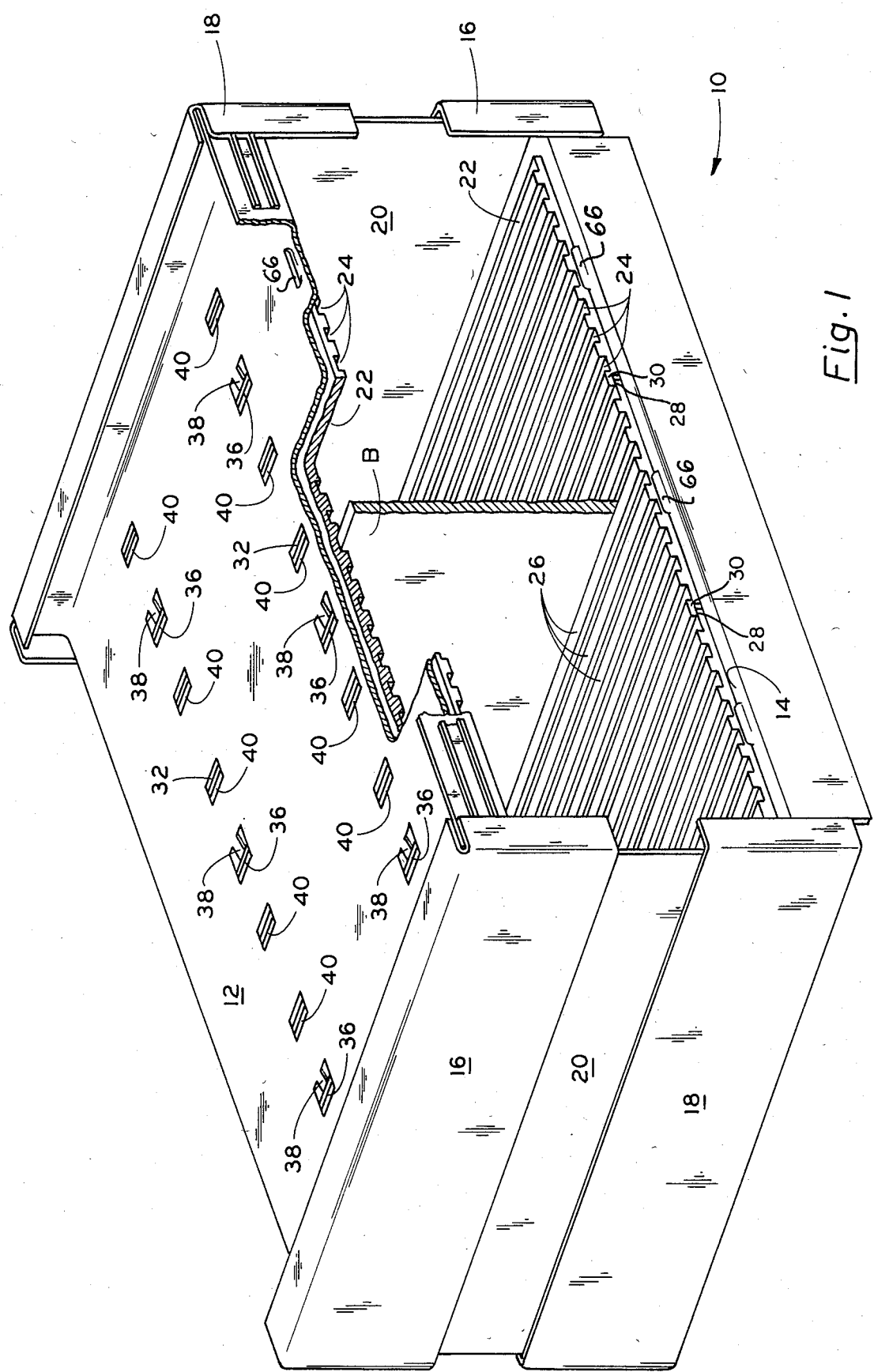
FIG. 1 is an elevated perspective view, partially broken away of a circuit board storage cabinet formed in accordance with the present invention.

As seen in FIG. 1, the printed circuit board storage cabinet generally designated by the reference numeral 10 includes a pair of substantially parallel and oppositely opposingly spaced apart support members 12 and 14 which are identical in construction.

The supporting members 12 and 14 are substantially flat and may be rectangular as shown, although their actual configuration or shape is not meant to constitute a limitation of the present invention. Each of the support members 12 and 14 are provided with a pair of substantially perpendicular side portions 16 and 18 depending from its opposite ends. The side portions 16 and 18 are designed to fit over an intermediate adjustment wall 20 which maintains the support members in opposed parallel relationship with each other. The side walls 16 and 18 and the intermediate wall 20 can be provided with suitable adjustable fastening means (not shown) similar to that of my prior aforementioned patents whereby the height of the top support member 12 may be adjusted relative to the bottom support member 14, thereby creating a cabinet adjustable to accommodate predetermined lengths or widths of printed circuit boards.

Printed circuit boards B (one only being shown) are intended to be retained in the cabinet 10 substantially perpendicular to and between the parallel and opposingly spaced support members 12 and 14 and consequently substantially parallel to the side walls 16 and 18.

To effect this supported relationship a plurality of circuit board guide or retaining plates individually and collectively designated 22, are supported or carried on the interior defined surface of each of the support members 12 and 14.

Each of the retaining plates 22 is generally planar, rectangular plates having one or more grooves 24 into which the printed circuit boards are slidably inserted, and spacing ribs 26 which separate the boards from contact with each other. The plates 22 are preferably formed of plastic being molded, pressed or otherwise formed, so that the grooves and ribs extend parallel to the longitudinal edges. The plates are supported or carried on the interior defined surfaces of each of the support members 12 and 14 in edge abutment and interlocking relationship. Further, the plates are arranged in paired opposition with the grooves 24 and ribs 26 of the plates on the upper support member 12 being disposed vertically facing the corresponding grooves 24 and ribs 26 in the lower plates on the lower supporting member 14.

In general, the storage cabinet as so far described including the printed circuit board retaining plates is similar to the construction as shown in the aforementioned U.S. Pat. Nos. 4,184,599 and 4,277,120 and reference is made thereto for further details of construction.

It is with regard to the construction of the printed circuit board guide and retaining plates 22 and their cooperative attachment to the supporting members 12 and 14 in which the present invention distinguishes from that shown in the aforementioned patents. Securing and locking the printed circuit board guides or retaining plates 22 to the support members 12 and 14 results from this novel combination of structures provided on both the printed circuit board guides or retaining means 22 and also on the support members 12 and 14.

The present invention is illustrated in FIGS. 2-5 by describing only the cooperative construction of the upper supporting members 12 and its associated printed circuit board guide or retaining plates 22, since the corresponding lower members are identical in construction.

Figure 2:
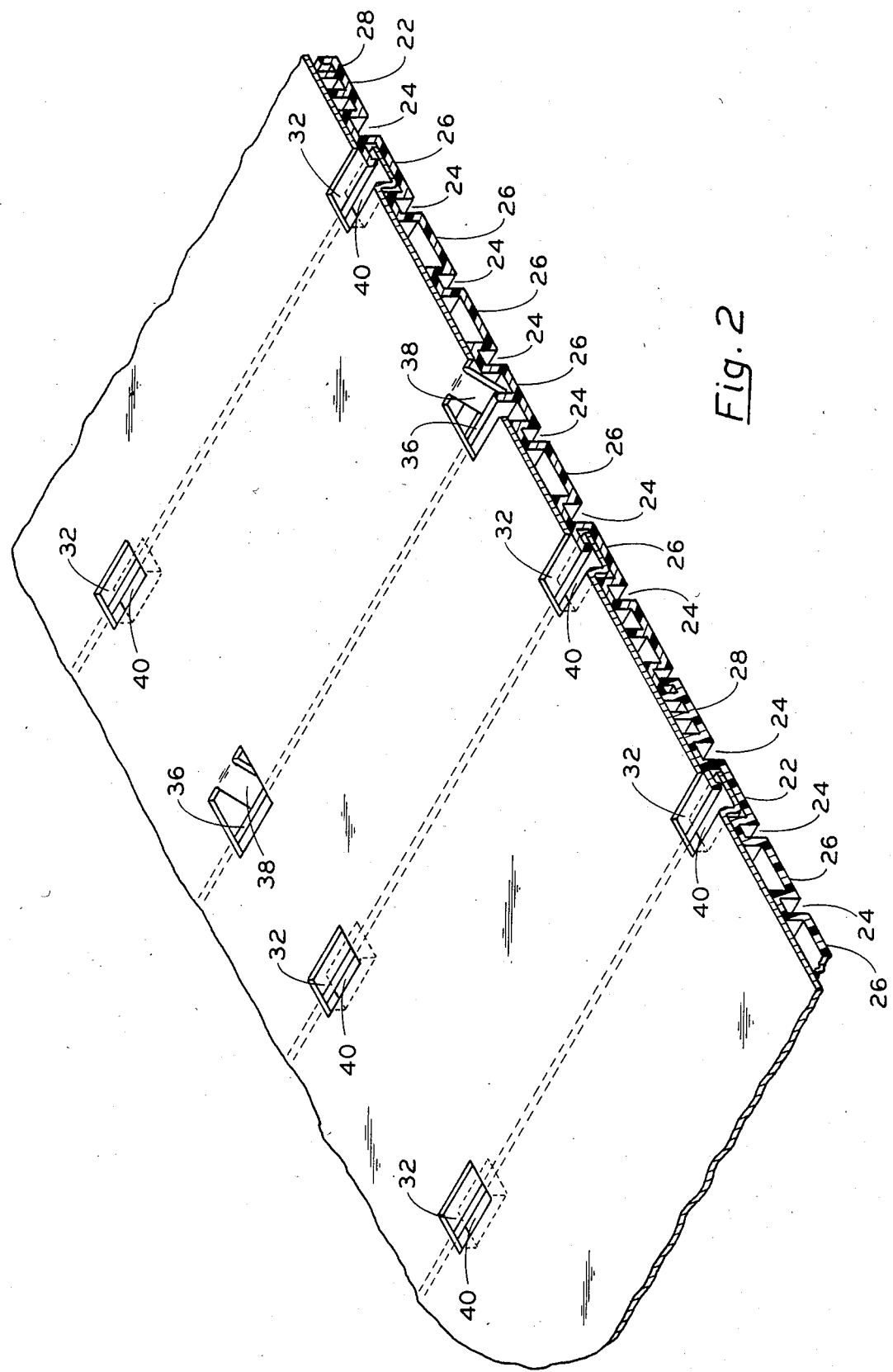
FIG. 2 is a perspective view partially in section showing the upper supporting member of the storage cabinet and the retaining plates secured thereto.
Figure 3:
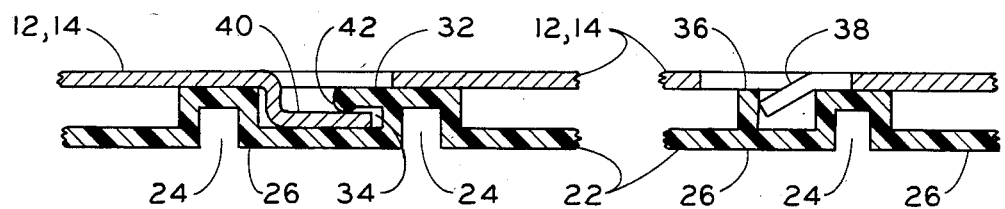
FIG. 3 is a sectional plan view of the retaining plate and supporting member, shown in FIG. 2.

In the embodiment of FIGS. 2 and 3, the retaining plates 22 have a somewhat corrugated configuration, wherein the grooves 24 and ribs 26 are formed above and below each other. Thus, the back of each groove 24 can serve as an abutment surface and spacer in contact with the surface of the supporting member 12, 14. Interengagement of the longitudinal edges of adjacent retaining plates 22 may be made if desired by providing each of the plates with a laterally extending ledge 28 along one longitudinal edge, and a laterally extending overhang 30 along the opposite longitudinal edge. The ledges 28 and overhangs 30 are formed respectively below and above the central plane of the retaining plates with their outer surfaces coplanar with back surfaces of the grooves 24, so that when overlapped the two adjacent retaining plates interengage in a continuous uniform thickness.

Turning to the retaining plate itself, there is formed on its backside a pair of relatively spaced re-entrant shaped locking bars 32 which extend for substantially the full length and along the back of each plate 22. Each locking bar overlaps the recessed portion of the adjacent rib 26 and is spaced therefrom to provide a continuous longitudinal channel 34 the height of which is slightly less than the thickness of the members 12 and 14. Athough the number of locking bars 32 is not critical, it has been found advantageous to provide only two, one arranged integrally with the back of the groove 24 nearest the ledge 28 and the other similarly integral with the back of the groove 24 nearest the overhang 30. The locking bars 32 extend parallel to the ledge 28 and overhang 30, and form with the recess below it the longitudinally continuous channel 34 for lateral penetration by a plurality of supporting fingers. In addition, a locking ridge 36 is formed to project upward from the back of the retaining plate 22 in planar alignment with the flat top of ledge 34 and substantially midway between the locking bars 32.

Relatively spaced in and across the width of the supporting members 12, 14 is an array of holding elements of two types, each of which is formed by cutting the surface of the supporting members 12, 14 and bending its material to produce resilient fingers integral and unitary therewith. The first type of holding element comprises a relatively narrow finger 38 that extends outwardly from the right toward its free end at the left as seen in FIGS. 2 and 3. Finger 38 is merely bent out of the plane of the surface 12.

The other type of holding element is shown as a wider finger 40 that extends from its joined left toward its free end at the right as seen in FIGS. 2 and 3. Finger 40 is curved and bent more sharply so as to extend substantially below and into surface supporting engagement within the confines of the continuous channel 34. The holding elements 38 and 40 may be arranged in aligned pairs as shown along the front and rear transverse edges of the support members 12 and 14, and parallel to the longitudinal side edges. In practice, it has been found that one pair of elements 38 of the first type and two pairs of elements of the second type are sufficient to properly mount and support the plates 22 to their respective members 12 and 14.

The retaining plates 22 are easily and quickly asembled on the respective supporting members 12 and 14 by aligning the continuous channels 34 thereon with the fingers 40 that project out of the planes of their respective members 12 and 14 and into the direction of the interior of the cabinet. Before sliding one plate 22 at a time into the cabinet interior, it is convenient to position the locking fingers 38 in substantial alignment with the plane of its member 12 or 14. This assures that the locking finger will not obstruct or interfere with the sliding movement of the plate into the cabinet.

Each plate 22 may now be slid into cooperation with its channel supporting fingers 40. After the first plate of a series or group of plates is slid into position on the supporting member 12 or 14, the next plate of the series or array is similarly positioned to align its channels 34 with its respective support fingers 40. To assure a close cooperation between the new plate and the already positioned plate in the cabinet, the ledge 28 or its overhang 30 of the new plate is aligned in interfitting cooperation with the corresponding structure of the plate already positioned in the cabinet. Thereafter the new plate is slid into position along its support member 12 or 14.

After all the plates are supported at their channels 34 by the fingers 40 to their members 12 or 14, and with each other at their cooperating ledges 28 and overhangs 30, the locking fingers are depressed toward the respective plates 22 to cause them to engage with and extend into locking engagement behind the locking ridges 30 as can be seen in FIGS. 1, 2 and 3.

It will be noted that the locking fingers 38 are opposed in direction to the channel supporting fingers 40. Hence, this final locking engagement of the fingers 38 with the ridges 36 forces each plate 22 to move into close cooperation with the next adjacent plate 22 and forces its locked plate into tighter non-displaceable cooperation with the oppositely directed supporting fingers 40. After the whole array of plates is so locked and secured in the manner described, they are then incapable of movement relative to each other and with respect to their supporting members 12 and 14.

Removal of any one or more of the so secured plates is easily made by reversing the procedure. That is to say, all that is necessary is to move the locking fingers 38 out of locking engagement with the ridge 36 of the plate to be removed. This frees the plate and permits it to be slid smoothly and easily out of the cabinet and free of engagement with the adjacent array of plates that remain locked in the cabinet. Just as easily as the original assembly of plates was made, another plate may be substituted for and slid into the space left by the removed plate. Once in position, the locking fingers 38 are again sprung into engagement with the ridges 36 of the new plate to lock it securely into and as an integral part of the array of plates previously locked to the members 12 or 14.

Engagement with and support of the plates 22 by the fingers 40 with the channels 34 is made more secure and snug by providing the locking bars 32 with a longitudinally extending protrusion 42 that projects into the path of the channel 34. The protrusions 42 extend from their locking bars into interference with the opening of the channel 34 to narror the opening. Thus, when the fingers 40 are positioned within the channels, the protrusion forces the fingers into a snug fitting engagement and receipt within the channel with the bottom of the fingers 40 in surface to surface contact and engagement with the bottom of the channels 34.

Figure 4:
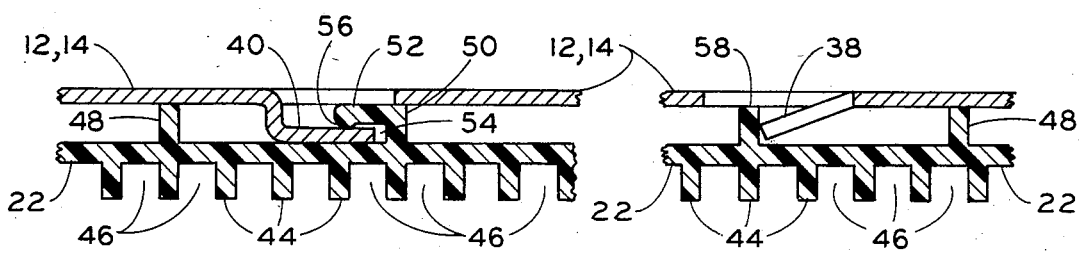
FIG. 4 is a view similar to that of FIG. 3 showing a modified retaining plate having different width grooves and spacings.
Figure 5:
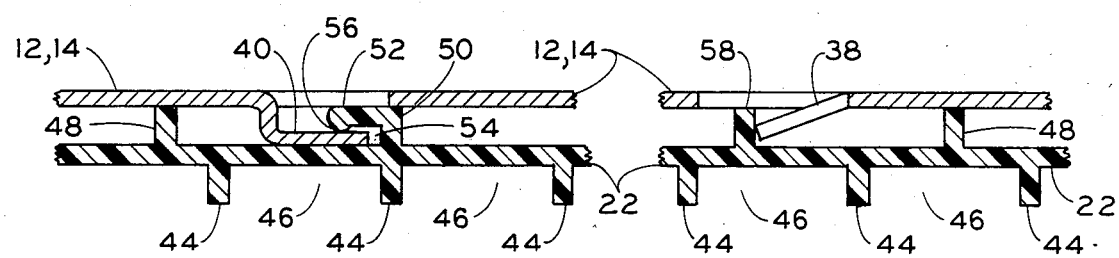
FIG. 5 is still another view similar to that of FIG. 4 showing still another groove configuration.

The embodiments shown in FIGS. 4 and 5 differ from that shown in FIGS. 2 and 3 in the organization of details of the retaining plate only. In the embodiments of FIGS. 4 and 5, each of the retaining plates 22 comprises a flat generally planar sheet having extending from the front surface facing into the cabinet a plurality of substantially parallel relatively spaced flat ribs 44 which form a plurality of grooves 46 across the width of the plate. The ribs 44 are all parallel to the longitudinal edges of the retaining plate and extend perpendicularly to the plane of the plate 22. The number of ribs, and thus the number of grooves formed in the plate will, of course, vary from plate to plate, and may even vary within the plate itself. Preferably, plates are made in sets with ribs and grooves in predetermined patterns.

Extending normally from the back surface which is positioned against the supporting member 12 or 14 are a plurality of strengthening ribs 48 which act also to space the retaining plate 22 from the surface of the respective supporting member 12 or 14 by the distance of the channel forming bars 52. As in the prior plate, spaced at predetermined intervals from each other are a pair of elongated locking bars 50 having an L-shaped cross section extending the full length of the retaining plate 22. The exposed top portion 52 of the L-shaped locking bar 52 extends over the back surface of the flat retaining plate 22 forming therewith a channel 54 and is provided along its edge with a protrusion or dimple 56 which also runs the entire length of the locking bar. The protrusion 56 functions like 42 of the prior plate and assures supporting engagement between the surfaces of the channel and the supporting finger 40. As in the prior art, a locking ridge 58 is formed extending upwardly from the top surface of the retaining plate and extends for the full length thereof.

The supporting members shown in FIGS. 4 and 5 are identical to those shown in FIG. 2 and 3, and therefore the cooperation between the fingers 38 and 40 with the locking ridge 58 and the locking bar 50 respectively is the same as previously described. The insertion into and removal of the plates of these embodiments from the cabinet is performed exactly in the manner previously described. The differences between the plates of FIG. 4 and FIG. 5 can be seen in the relative spacing of the ribs 44 that result in the narrower printed circuit board grooves 46 of FIG. 4 as compared to the wider grooves of FIG. 5.

Figure 6:
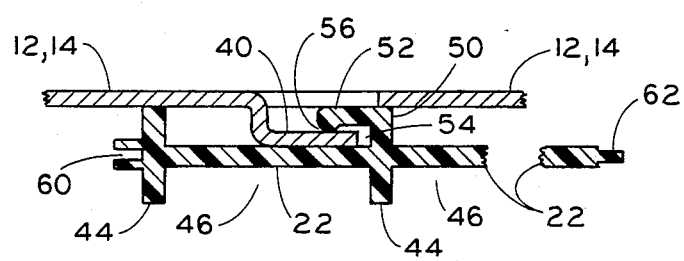
FIG. 6 is an end section in smaller scale showing the lateral edge configuration of the retaining plate.

Another modification is shown in FIG. 6 wherein the side edges of the retaining plate members 22 provide a different edge to edge interlocking and interfitting engagement than described with respect to FIGS. 1–3. One longitudinal edge of the retaining plate 22 is formed with a laterally facing slot 60 while along the other edge, the sheet is formed with a laterally extending insertion flange 62. Interlocking of the adjacent retaining plates can thus be made by the insertion of the flange 62 into the slot 60, rather than with the ledge 28 and overhang 30 of FIG. 2. The sliding interfit and engagement effected by the slot 60 that borders the flange 62 provides for their relative guided sliding movement and cooperating support.

One or both of the side walls 16 and/or 18 of the storage cabinet may, however, be provided with a corresponding elongated slot or flange corresponding in size, shape and location to receive therein the free or exposed lateral flange 62 or slot 60 formed on the edge of the retaining plate 22 facing the same. In like manner, the opposite side wall may be provided with a lateral flange or slot for supporting engagement with the free slot or flange on the facing edge of a retaining plate. This will assure that both free ends of the plate array supported in each of the members 12 and 14 are supported at their ends.

While the ribs 26, 44, and grooves 24, 46 on the exposed surface of the retaining plate may be varied in their spacing, it is essential that the locking bars 32, 50 and the locking ridge 36 on the back surface of the retaining plates be arranged parallel to each other at specific distances from their adjacent edges, as well as from each other for the reasons which will become obvious from the placement of the locking fingers 38, 40 on the supporting members which must be conformingly spaced. That is to say, that all of the retaining plates, no matter for which printed circuit board it is intended to be used, must have a back which is identical to all the other plates used in a particular storage cabinet. In addition, the width-wise dimension of each retaining plate must be identical and must be a whole fraction of the width of the storage cabinet, in order to enable a plurality of such plates to fit perfectly across the width of the supporting members and to enable the free exchange and interchange of the retaining plates in any such fractional section of the storage cabinet.

Each of the described retaining plates is further limited from unwanted or accidental displacement from the cabinet by its abutment against a rear wall or stop that may be provided in the cabinet. Such rear wall or stop may be much in the nature of the restraining or stop means designated 42 of my U.S. Pat. No. 4,184,599 or the stop means or restraining bar of my U.S. Pat. No. 4,277,120. When positioned against the rear wall abutment, the opposite end of each plate is blocked from removal from the cabinet entrance by a detent or lip 66 that is deformed in each of the members 12 and 14. The detent or lip 66 extends out of the plane of the member 12 or 14 and into the path of each plate to abuttingly engage with the end of the plate when the plate is positioned within the cabinet. Thus, prior to removal of the plates, they must first be bent slightly to disengage them from the abutment 66 before they can be slid out of the cabinet.

It will be seen from the foregoing, that assembly of a printed circuit board storage cabinet has been simplified, particularly with regard to providing curcuit board retaining plates which are easily installed, removed and exchanged. The removal and/or exchange of a single retaining plate can be effected without disturbing any of the other plates, even when circuit boards are held between the other plates. This results from the fact that each plate is held to the supporting member by its own cooperative means (i.e. locking bars, locking ridge and depending fingers) and is totally independent of any adjacent retaining plates. Release of the locking fingere 38 from the locking ridge, releases only the specific plate. The side edges (slots, flanges, overhangs and ledges) even when used act merely to create a continuous planar surface while permitting relative sliding of adjacent plates, once the locking finger is released. Insertion and removal is effected by sliding only, in a plane parallel to the surface of the supporting member.

While there have been shown and described and pointed out the fundamental novel features of the invention as applied to a preferred embodiment thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto.

What is claimed is:

1. A storage cabinet for printed circuit boards comprising: a housing having a pair of substantially parallel and opposingly spaced flat surface support members for accommodating a plurality of printed circuit boards substantially normally therebetween, printed circuit board retaining members for detachable securement on each of said support members in the interior of said housing, said retaining members comprising a plural retaining plates, each being substantially flat and planar and having a front and a rear surface, said plates having grooves on the front surface extending uninterruptedly between its edges for supportingly receiving printed circuit boards which substantially conform in thickness to said grooves, and means for slidable detachable engagement of said plural plates on said support members, comprising a plurality of locking bars and at least one locking ridge each integral with and projecting out of the plane of said plates from the rear surface of said plates, said locking bars having in cross section a portion overlaying said plate and forming therewith a lateral channel, and a plurality of flexible resilient elongated first and second fingers each integral with and projecting out of the plane of said support members, said second fingers being bent downwardly and laterally from the plane of said supporting member in a direction opposite to said first fingers to enter into said lateral channel, said first fingers being bent downward and in a lateral direction to engage said locking ridge, and said first fingers urging said second fingers into said channel.

2. The storage cabinet according to claim 1, wherein said second fingers are arranged in pairs parallel to the longitudinal side edges of said support members and at predetermined distances from said side edges and from each other, said first fingers being arranged in a pair between adjacent pairs of said second fingers and at predetermined distances therefrom, said retaining plates having said locking ridge and locking bars arranged and spaced from each other conformingly to said first and second fingers.

3. The storage cabinet according to claim 1, including means on each of said plates for interlocking adjacently disposed ones of said plates so as to form a substantially continuous and unbroken planar surface of a plurality of said adjacently disposed plates as though the same were unitarily formed, the plurality of grooves of one of said plates being capable of being of a predetermined width different from that of the grooves of others of said plates.

4. The storage cabinet according to claim 3, wherein said means for interlocking said plates comprises a ledge extending laterally from the lower surface of said retaining plate along one longitudinal edge of said retaining plate and an overhang extending laterally from the upper surface of said retaining plate along the opposite longitudinal edge.

5. The storage cabinet according to claim 3, wherein said means for interlocking said plates comprises a slot along one longitudinal edge and a flange extending along the opposite edge.

6. The storage cabinet according to claim 1, wherein the grooves defined in at least one plate on each support member have a predetermined width different from the width of the grooves in the other plates so as to enable printed circuit boards of different thickness to be simultaneously accommodated in said cabinet.

7. The storage cabinet according to claim 1, wherein said locking bars and said locking ridge extend across the entire length of said retaining plate, said plates being slidable in abutment with said support member, said locking bar being slidable about said second fingers and said locking ridge being slidable in abutment with said first fingers.

8. The storage cabinet according to claim 7, wherein said first finger is flexibly bendable out of contact with said locking ridge to release said retaining plate from engagement with said supporting member.

9. The cabinet according to claim 1, wherein said retaining plates comprises a rectangular sheet, having a plurality of perpendicularly extending flat sided ribs on one surface defining, between said ribs, grooves for the reception of said printed circuit boards, said locking bars comprising an elongated rib having an L-shaped cross section, one leg being integral with and projecting perpendicularly from the rear surface of said plate and the other leg projecting from said one leg parallel to the said rear surface to form therewith said channel and said locking ridge comprising a flat sided rib projecting perpendicular from said rear surface of said plate.

10. The cabinet according to claim 9, including an elongated dimple formed along the free edge of said parallel leg of said L-shaped locking bar to reduce the opening of said channel.

* * * * *

UNITED STATES PATENT AND TRADEMARK OFFICE
CERTIFICATE OF CORRECTION

PATENT NO. : 4,558,398

DATED : December 10, 1985

INVENTOR(S) : LEO O. DRAKE

It is certified that error appears in the above-identified patent and that said Letters Patent are hereby corrected as shown below:

IN THE CLAIMS:

Claim 2, line 3, delete "longitudinal"

Signed and Sealed this

Twenty-second Day of April 1986

[SEAL]

Attest:

DONALD J. QUIGG

Attesting Officer

Commissioner of Patents and Trademarks